(12) United States Patent
Kuo (10) Patent No.: US 7,617,706 B1
(45) Date of Patent: Nov. 17, 2009

(54) DOUBLE SIDE LOCKING DEVICE FOR AN INDUSTRIAL COMPUTER

(75) Inventor: Jimmy-S S. Kuo, Taipei (TW)

(73) Assignee: Lif J.K. Corporation, Sijhih, Taipei County (TW)

( * ) Notice: Subject to any disclaimer, the term of this patent is extended or adjusted under 35 U.S.C. 154(b) by 0 days.

(21) Appl. No.: 12/168,915

(22) Filed: Jul. 8, 2008

(51) Int. Cl.
*E05B 73/00* (2006.01)

(52) U.S. Cl. .......................... 70/58; 292/182; 312/333; 361/679.57

(58) Field of Classification Search ................. 292/182; 70/58, 120; 211/4, 7–9; 248/551–553; 361/679.57, 361/679.58; 109/47; 312/334.5, 334.4, 333, 312/218, 219, 223.1, 265.1–265.4
See application file for complete search history.

(56) References Cited

U.S. PATENT DOCUMENTS

| | | | | |
|---|---|---|---|---|
| 203,232 A | * | 4/1878 | Worthington | 292/37 |
| 1,194,022 A | * | 8/1916 | Hudson | 292/182 |
| 1,264,840 A | * | 4/1918 | Nemeth | 70/134 |
| 1,450,242 A | * | 4/1923 | Blalock | 292/182 |
| 1,871,142 A | * | 8/1932 | Bianchi et al. | 292/182 |
| 1,901,613 A | * | 3/1933 | Smith | 70/259 |
| 2,077,135 A | * | 4/1937 | Walker | 292/33 |
| 2,537,736 A | * | 1/1951 | Carlson | 292/182 |
| 2,588,356 A | * | 3/1952 | Burgoyne | 292/182 |
| 2,591,901 A | * | 4/1952 | Wickes et al. | 109/19 |
| 2,887,735 A | * | 5/1959 | Coffey | 49/366 |
| 3,002,785 A | * | 10/1961 | Larche | 296/120.1 |
| 3,216,067 A | * | 11/1965 | Bailey | 49/405 |
| 3,711,139 A | * | 1/1973 | Polk, Jr. | 292/37 |
| 3,792,884 A | * | 2/1974 | Tutikawa | 292/37 |
| 3,984,136 A | * | 10/1976 | Bills | 292/182 |
| 5,149,152 A | * | 9/1992 | Lanius | 292/37 |
| 5,232,260 A | * | 8/1993 | Lippard | 296/51 |
| 5,794,467 A | * | 8/1998 | Justice | 70/118 |

* cited by examiner

*Primary Examiner*—Lloyd A Gall (57) ABSTRACT

A lock assembly for an industrial computer to be locked and unlocked to a supporting frame set includes an insertion hole arranged on each of the two lateral sides of supporting frame set, a lock device arranged on a panel of the industrial computer, a push block formed to the lock device, and two insertion rods which are capable of pushing and being pushed by the push block. When the lock device is unlocked, the push ends of the insertion rods will elastic push the short axis end of the push block so as the insertion buckle ends will leave the insertion holes of the supporting frame set, and then the industrial computer is unlocked. While the lock device is locked, the push ends of the insertion rods will elastically push the long axis side of the push block so that the insertion buckle end will insert into the insertion hole of the supporting frame set.

2 Claims, 8 Drawing Sheets

DOUBLE SIDE LOCKING DEVICE FOR AN INDUSTRIAL COMPUTER

FIELD OF THE PRESENT INVENTION

The present invention relates to an industrial computer, and particular to a double side locking device for an industrial computer.

DESCRIPTION OF THE PRIOR ART

Figure 7:
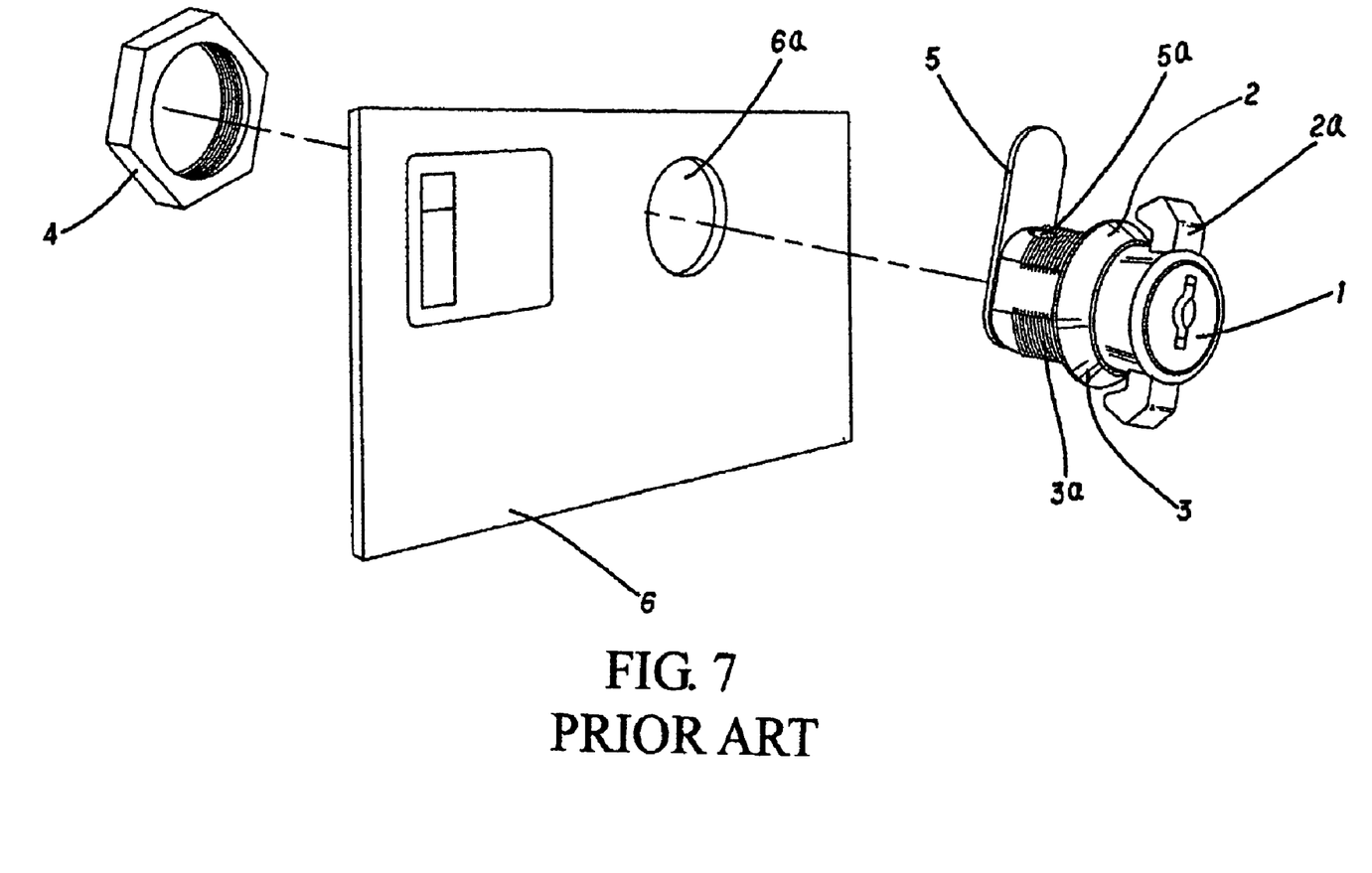
FIG. 7 shows the disassembly of a prior lock device and a panel of a computer device.
Figure 8:
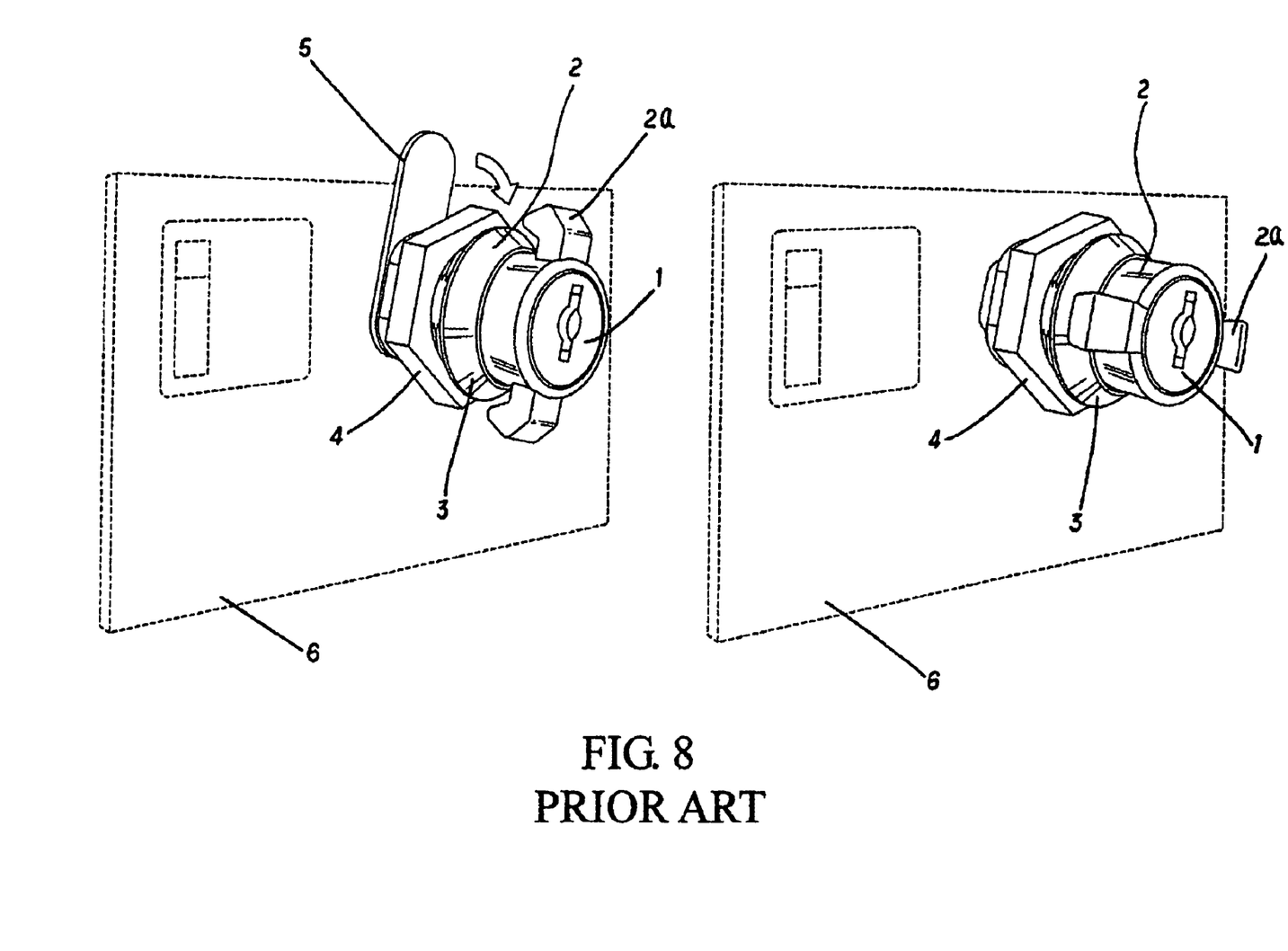
FIG. 8 is a prospective view of the present invention showing the prior lock device installed to the panel of the computer device in both lock and unlock status.

A prior thin type industrial computer such as a monitor and keyboard set with 1 U highness (which is 4.45 cm), a computer main frame, and other computer devices are slid installed to a supporting frame set by assembling tracks on the two sides thereof. The computer can be stored inside the supporting frame set and be drawn out for using. For the purpose of receiving the industrial computer inside the supporting frame set firmly and tightly, a lock device is arranged to a side of a front panel of the industrial computer. By rotating a locking sheet with a key to buckle a locking groove on a side of the supporting frame set, the computer device is locked within the supporting frame set without sliding out and being damaged. Referring to FIGS. 7 and 8, the prior lock device includes a locking core 1, sleeve 2, casing 3, tightening unit 4, and a locking sheet 5. The locking core 1 is installed within the sleeve 2, and the sleeve 2 is installed within the casing 3. Through the thread 3a of the casing 3 being screwed by the tightening unit 4, the casing 3 with the locking core 1 and the sleeve 2 will be installed to a panel 6 of an industrial computer through a through hole 6a. The locking sheet 5 and a top tip 5a are arranged to a back end of the sleeve 2 and capable of being rotated and raised with the sleeve 2 so as to buckle or leave the locking groove of the supporting frame set (not shown in the drawings). In operating, when a locking core 1 is unlocked, a user can rotate a handle 2a formed on a front end of the sleeve 2 so as to rotate the locking sheet 5 on the back end of the sleeve 2 for the purpose of locking or unlocking the computer device. While the locking core 1 is locked by a key, the locking core 1, sleeve 2, and casing 3 are locked together so the locking sheet 5 is impeded by the casing 3 from being rotated. Thus the industrial computer is being locked.

However, the prior lock device has following disadvantages. Firstly, the lock device is usually arranged with one to a proper side of panel 6 of a computer device. Then a thief can use a special tool to rotate the locking sheet 5 through the gap between the panel 6 and the supporting frame set, or apply a force the locking sheet 5 to deform and leave the locking groove on a side of the supporting frame set. Thus, the lock device is easy to unlock and break. Secondly, when the prior lock device is used on a monitor and keyboard set, the monitor and the keyboard will have a gap therebetween because of a torque shaft used for opening and closing the monitor. The torque shaft will still apply a force to the monitor when it is closed and thus a gap between the monitor and the keyboard is remained. Therefore, while a side of panel 6 of the monitor and keyboard set is buckled to the supporting frame set, a front end thereof will raise and being scratched and collided to the supporting frame set then causes a damage.

SUMMARY OF THE PRESENT INVENTION

Accordingly, the primary object of the present invention is to provide a lock device for an industrial computer to improve the locking effect and the burglarproof ability.

Another object of the present invention is to provide a lock device for an industrial computer to keep the level in a locking status so as to prevent a device, such as a monitor, from being scratched and collided to a supporting frame set.

The industrial computer equipped with the lock device of the present invention will have a better locking effect and burglarproof ability through the double sides locking between the two insertion rods assembled on the industrial computer and the two insertion holes of the supporting frame set. Also, by the double sides locking structure, the two sides of the industrial computer will be at the same level to prevent a monitor being scratched and collided to the supporting frame set so as to keep the safe of the industrial computer.

To achieve above object, the present invention provides a lock assembly of an industrial computer comprising: a supporting frame set using for slidably installing an industrial computer and having an insertion hole at each of two sides of a front panel of the industrial computer at an inner wall thereof; a lock device including a casing, a sleeve, and a locking core; the casing being locked to the front panel of the industrial computer; the sleeve being installed within the casing; a front end of the sleeve having a driving bar and a rear end thereof having an extending section which protrudes toward an inners side of the panel; the driving bar being capable of driving the sleeve and the extending section to rotate; the locking core being installed within the sleeve for receiving a key for locking or unlocking; in unlocking, the sleeve being rotatable; in locking, the sleeve and the locking core being locked together to the casing so that they can not be rotated; a push block being locked to the extending section of the sleeve so as to rotate with the sleeve; the push block further having an elliptical shape including two opposite sides forming a long axis and two other opposite sides forming a short axis; and positions of the long axis and short axis capable of being changed by rotation of the push block; and two insertion rods being arranged to the inner wall of the panel; each of the insertion rods having a push end and an insertion buckle end; the insertion rods further capable of being pushed by a spring so that the push end of the insertion rod will contact the edge of the short axis of the wall of the push block; meanwhile the insertion buckle end leaving the corresponding insertion hole of the supporting frame set; when the push block being rotated, the contact point of the wall and the push end of the insertion rod shifting from the short axis to the long axis so as to push the push end to overcome the spring applied on the insertion rod; and thus a transversely movement being happened and the insertion buckle end being inserted into the opposite through hole of the supporting frame set so as to lock to the frame.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
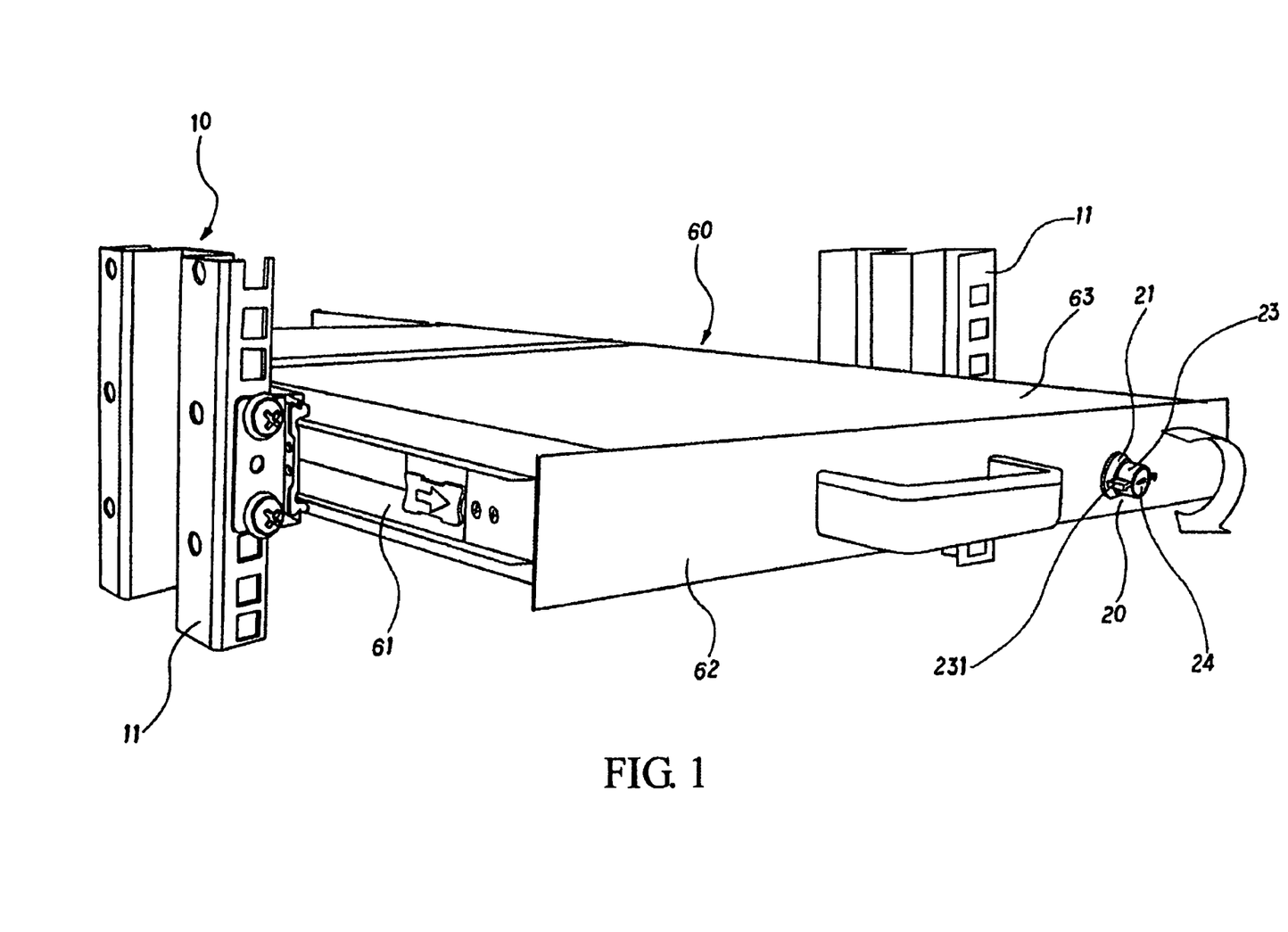
FIG. 1 shows the present invention installed to a panel of an industrial computer, and the industrial computer is unlocked.
Figure 2:
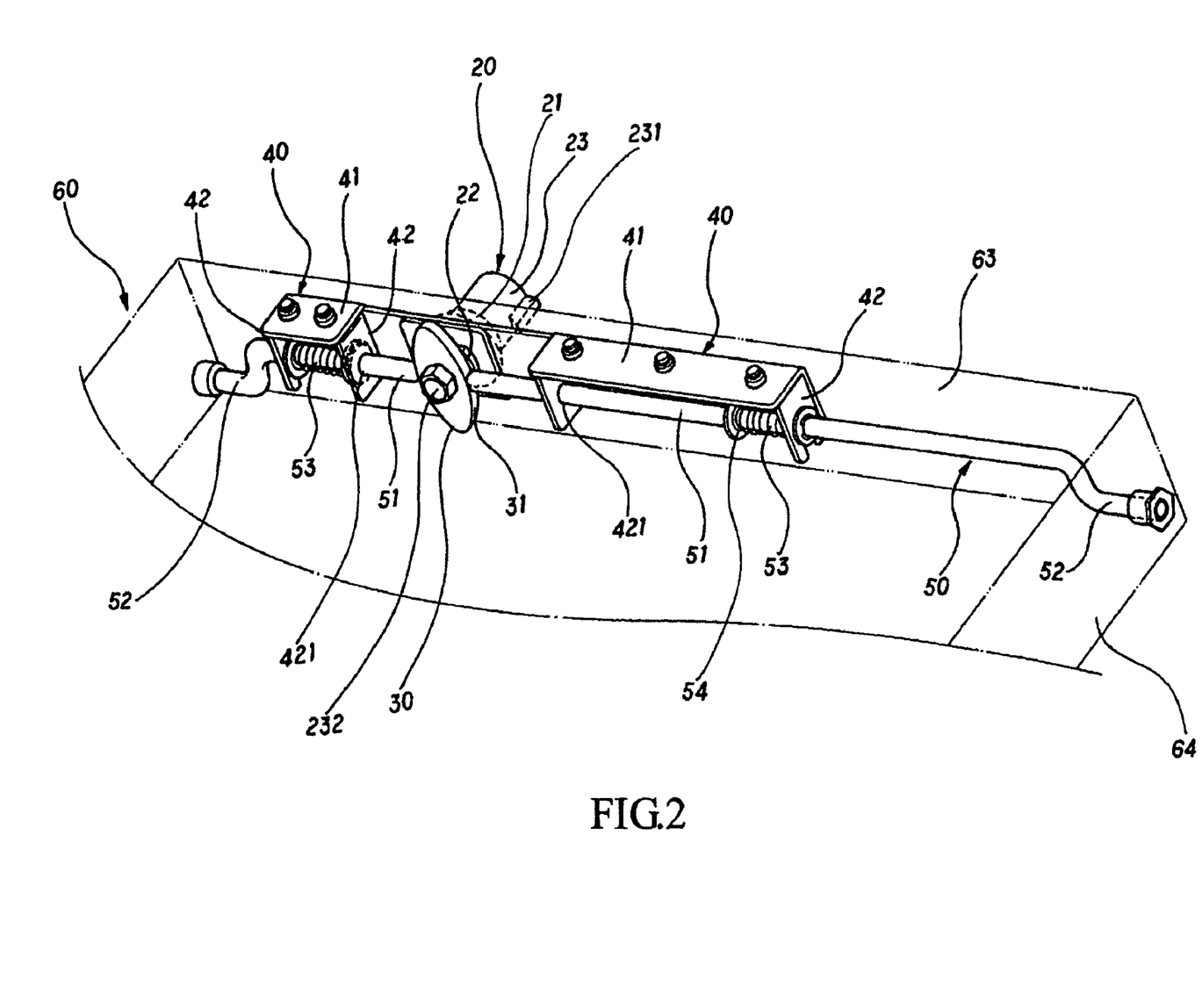
FIG. 2 is a prospective view showing the assembly of the present invention inside the panel.

Referring to FIGS. 1 and 2, a locking assembly for an industrial computer is illustrated. The assembly includes a supporting frame set 10, a lock device 20, a push block 30, two supporting plates 40 and two insertion rods 50.

Figure 3:
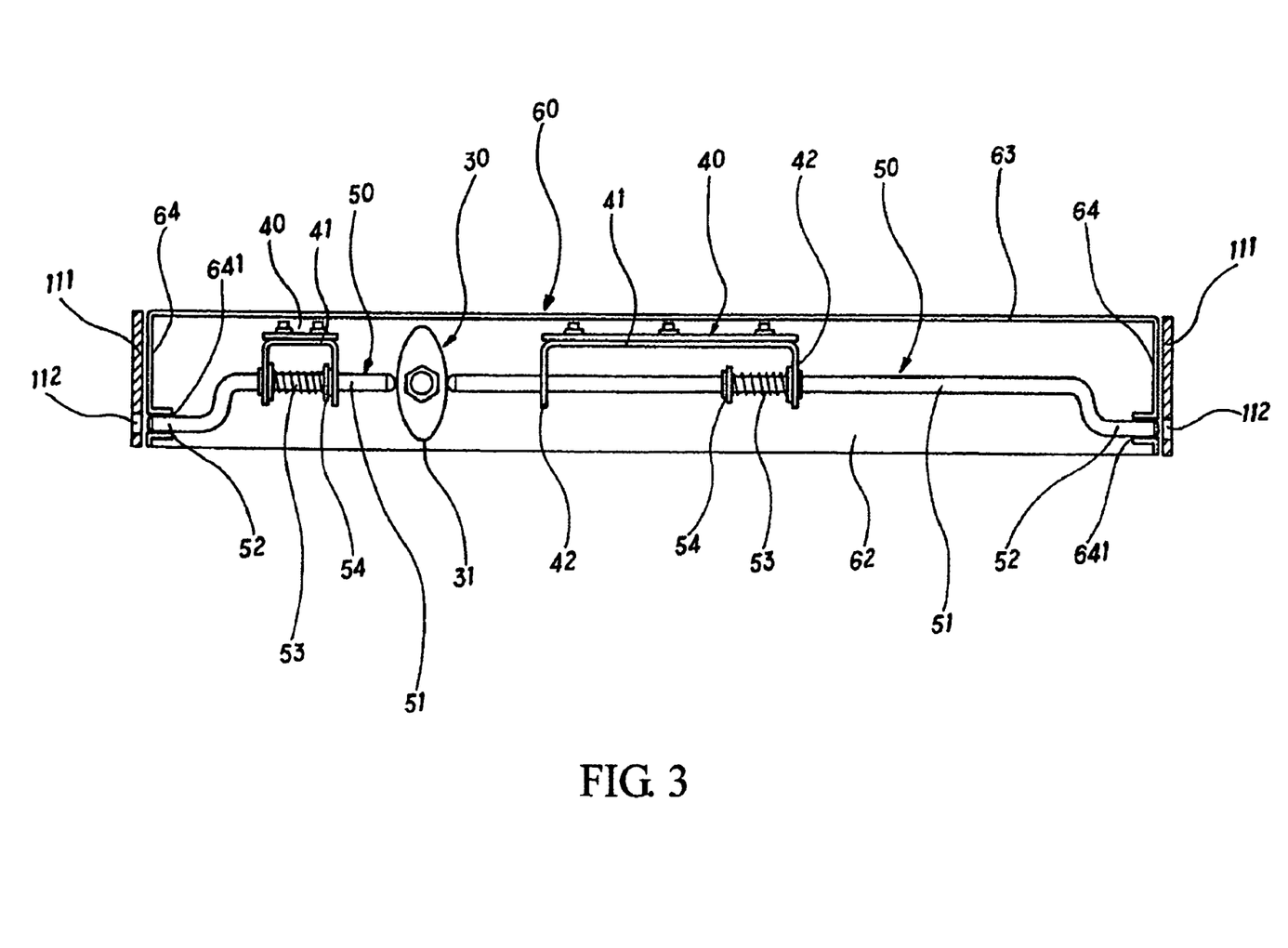
FIG. 3 is a schematic view showing the present invention inside the panel and being unlocked.
Figure 4:
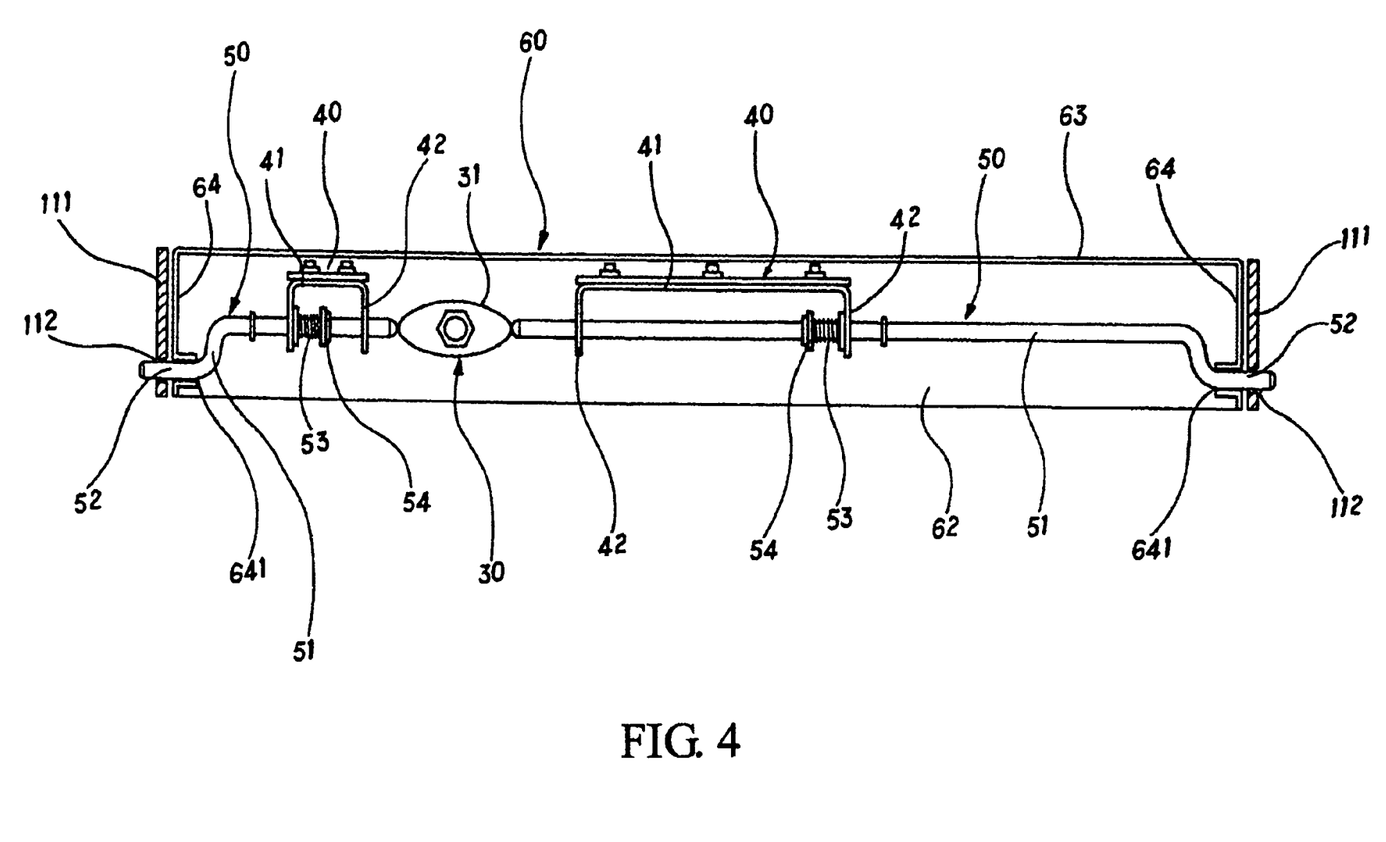
FIG. 4 is a schematic view showing the present invention inside the panel and being locked.

The supporting frame set 10 is approximately identical to those used in the prior arts, which is mainly used for slidably installing an industrial computer 60 by, for example, installing two tracks 61 at two sides of the industrial computer 60. Moreover, each of four corners of the supporting frame set 10 has a supporting post 11. In the present invention, each of two posts 11 at two sides of the front panel 62 of the industrial computer 60 has an insertion hole 112 at an inner wall 111 thereof, as shown in FIGS. 3 and 4.

The lock device 20 is approximately identical to those used in the prior arts. The lock device 20 has a casing 21, a tightening unit 22, a sleeve 23 and a locking core 24. The casing is locked to the front panel 62 of the industrial computer 60 by locking of the tightening unit 22. The sleeve 23 is installed within the casing 21. A front end of the sleeve 23 has a driving bar 231 and a rear end thereof has an extending section 232 which protrudes toward an inner side of the panel 62. A hand can drive the driving bar 231 to further drive the sleeve 23 and the extending section 232 to rotate. The locking core 24 is installed within the sleeve 23 for receiving a key (not shown) for locking or unlocking. In unlocking, the sleeve 23 can be rotated. In locking, the sleeve 23 and the locking core 24 are locked together to the casing 21 so that they can not be rotated.

The push block 30 is the main feature of the present invention. The push block 30 is locked to the extending section 232 of the sleeve 23 so as to rotate with the sleeve 23. In the present invention, the push block 23 has an elliptical shape including two opposite sides forming a long axis and two other opposite sides forming a short axis. Rotation of the wall 31 of the push block 30, the positions of the long axis and short axis can be changed.

The two supporting plates 40 are also the main feature of the present invention. Each supporting plate 40 has an approximate U shape. Each supporting plate 40 has a base plate 41 and two supporting sheets 42 at two opposite ends of the supporting plate 40. Each base plate 41 can be locked to an inner wall of a top plate 63 of the panel 62. Each supporting sheet 42 has a through hole 421.

The two insertion rods 50 are also the main feature of the present invention. The insertion rods 50 are formed with bent round rods. Each of the insertion rods 50 can penetrate through the opposite through holes 421 of the corresponding supporting sheet 42 of the supporting plate 40. Each of the insertion rods 50 has a push end 51 and an insertion buckle end 52, and a retrieval spring 53 slips on the rod between the opposite through holes 421. As shown in the FIG. 3, each the insertion rods 50 further has a stop portion 54 for pushing by the retrieval spring 53 properly so as to push the push end 51 of the insertion rod 50 to contact the edge of the short axis side of the wall 31 of the push block 30, and the insertion buckle end 52 will leave the corresponding insertion hole 112 of the supporting frame set 10. When the push block 30 is rotated, the contact point of the wall 31 and the push end 51 of the insertion rod 50 will shift from the short axis to the long axis so as to push the push end 51 to overcome the spring of the insertion rod 50. Thus a transversely movement is happen and the insertion buckle end 52 will be inserted into the opposite through hole 112 of the frame 10 so as to lock to the frame 10 as shown in the FIG. 4.

In the lock structure of the industrial computer of the present embodiment, the lock device 20 can arrange through the panel 62. Therefore, the corresponding left and right supporting plates 40 and the insertion rods 50 can be modified with different lengths.

In the lock structure of the industrial computer of the present embodiment, a through hole 641 can be formed close to the panel 62 on each side plate 64 of the industrial computer 60. The through holes 641 are aligned to the insertion holes 112 of the supporting post 11 respectively so as the insertion rods 50 can insert into the through holes 641 and further lock into the corresponding insertion holes 112 respectively.

Figure 5:
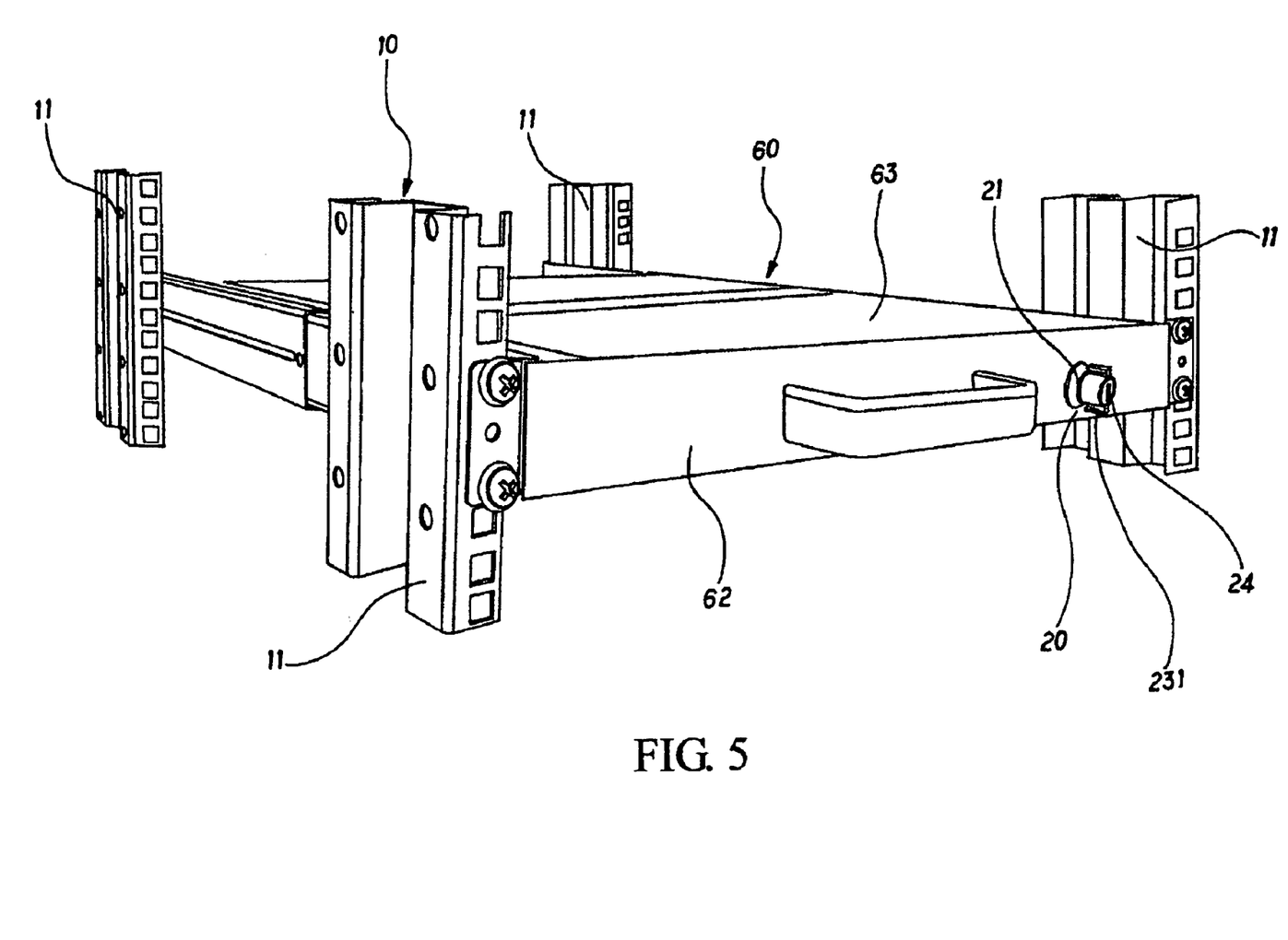
FIG. 5 shows the present invention installed to a panel of an industrial computer, and the industrial computer is received and locked.
Figure 6:
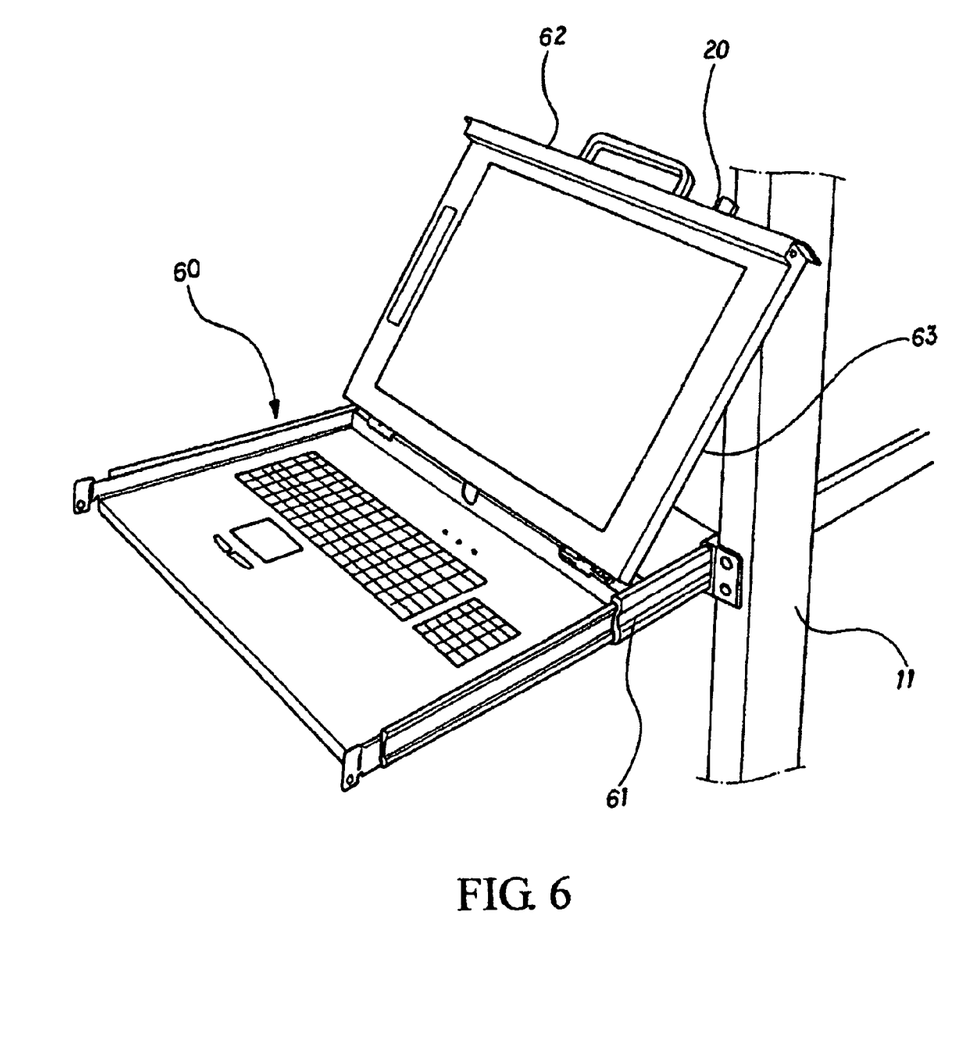
FIG. 6 is a schematic view of the present invention showing an industrial computer being pulled out and opened.

The operation of the lock device 20 of the present invention is approximately identical to those used in the prior arts. This is, when the locking core 24 of the lock device 20 is unlock by a key, the sleeve 23 is unlocked from the locking core 24 and becomes rotatable within the casing 21. Therefore, an operator can rotate the sleeve 23 manually to a predetermined direction and drive the push block 30 on a back side thereof as shown in the FIG. 1. When the long axis of the push block 30 is rotated to an up-down direction, the short axis is in the correlative left-right direction. Meanwhile, the push ends 51 of the insertion rods 50 touch to the short axis sides of the push block 30. Because of the short distance between the two ends of the short axis side of the push block 30 touched to the push ends 51 of the insertion rods, the two insertion rods 50 will sustain a spring force of the retrieval spring 53 and transversely move toward the push block 30 respectively. The movement distances of the insertion rods 50 is designed for the insertion ends of the two insertion rods can leave the through holes 112 of the supporting frame set 10 and received by the through holes 641 of the side plates 64 of the industrial computer 60 respectively, as shown in the FIG. 3, the industrial computer 60 is under a unlock status and can be pulled out of the supporting frame set 10 (as shown in FIG. 6). Inversely, when the industrial computer 60 is push back into the supporting frame set 10, the operator can reversely rotate the sleeve 23 so as to rotate the push block 30 on the back side of the sleeve. Accordingly, the long axis side of the push block 30 will back to a left-right direction and the short axis side thereof will in an up-down direction. Because of the long distance between the two ends of the long axis, the two insertion rods 50 will be pushed to move transversely outward by the push block 30 respectively during the rotation of the push block 30. The insertion ends 52 of the two insertion rods 50 will insert into the through holes 112 of the supporting frame set 10, as shown in the FIGS. 4 and 5, the industrial computer 60 is back to a lock status. Obviously, it is not an entirely lock status because a manual unlock and lock can be performed still. An entirely lock status is provided by inserting the key into the locking core 24 and rotating to lock the sleeve 23 to the locking core 24 within the casing 21. Thus a manual operation is no longer available and the industrial computer 60 is entirely locked.

Through the above description, the features and functions of the present invention is listed in the following.

1. Each left and right sides of the industrial computer 60 are arranged with a lock structure of the insertion rod 50 capable of buckling into the through hole 112 of the supporting post 11. Therefore, a double lock effect is provided. The industrial computer 60 can not be pulled out through unlocking only one side of the lock structure. The industrial computer 60 can only be pulled out by unlocking both sides of the lock structure thus the burglarproof ability is improved.

2. The lock assembly of the insertion rods 50 of the present invention is designed to move transversely to the supporting post 11. Therefore, the insertion rods 50 can be received within the through holes 641 of the side plates 64 of the industrial computer 60 and the insertion holes 112. Even if a specific tool is used to break the insertion rods 50 of the present invention, it is hard to engage through the gap between the industrial computer 60 and the supporting frame set 10.

3. Each side of the industrial computer 60 can be locked to the supporting post 11 of the frame 10 through the lock structure. Therefore a better leveling is applied so as to prevent a monitor from scratching and colliding to the supporting frame set 10.

4. The lock assembly of the present invention can be applied to various industrial computers 60 with the purpose of popularization and diversification.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A lock assembly of an industrial computer, comprising:
   a supporting frame set (10) for slidably installing an industrial computer (60) by installing two tracks (61) at two sides of the industrial computer (60; each of four corners of the supporting frame set (10) having a supporting post (11), and each of two posts (11) at two sides of a front panel (62) of the industrial computer (60) having an insertion hole (112) at an inner wall (111) thereof;
   a lock device (20) having a casing (21), a tightening unit (22), a sleeve (23) and a locking core (24); the casing being locked to the front panel (62) of the industrial computer (60) by locking of the tightening unit (22); the sleeve (23) being installed within the casing (21); a front end of the sleeve (23) having a driving bar (231) and a rear end thereof having an extending section (232) which protrudes toward an inner side of the panel (62); the locking core (24) being installed within the sleeve (23) for receiving a key for locking or unlocking; in unlocking, the sleeve (23) can be rotated;
   a push block (30) being locked to the extending section (232) of the sleeve (23) so as to rotate with the sleeve (23); the push block (30) having an elliptical shape including two opposite sides forming a long axis and two other opposite sides forming a short axis; rotation of the wall (31) of the push block (30), the positions of the long axis and short axis can be changed;
   two supporting plates (40); each of the two supporting plates (40) having an approximate U shape; each supporting plate (40) having a base plate (41) and two supporting sheets (42) at two opposite ends of the supporting plate (40); each base plate (41) can be locked to an inner wall of a top plate (63) of the panel (62); each supporting sheet (42) having a through hole (421);
   two insertion rods; each of the two insertion rods (50) being formed with bent round rods; each of the insertion rods (50) can penetrate through the opposite through holes (421) of the corresponding supporting sheets (42) of the supporting plate (40); each of the insertion rods (50) having a push end (51) and an insertion buckle end (52), and a retrieval spring (53) slipping on the rod between the opposite through holes (421); each of the insertion rods (50) further having a stop portion (54) for pushing by the retrieval spring (53) so as to push the push end (51) of the insertion rod (50) to contact the edge of the short axis side of the wall (31) of the push block (30).

2. The lock assembly as claimed in claim 1, wherein a through hole (641) is formed close to the panel (62) on each side plate (64) of the industrial computer (60); the through holes (641) are aligned to the insertion holes (112) of the supporting post (11) respectively so as the insertion rods (50) can insert into the through holes (641) and further lock into the corresponding insertion holes (112) respectively.

* * * * *